United States Patent
Ohhashi et al.

Patent Number: 5,466,355
Date of Patent: Nov. 14, 1995

[54] MOSAIC TARGET

[75] Inventors: Tateo Ohhashi; Koichi Nakashima; Hideaki Fukuyo; Takakazu Seki, all of Kitaibaraki, Japan

[73] Assignee: Japan Energy Corporation, Tokyo, Japan

[21] Appl. No.: 392,458

[22] Filed: Feb. 22, 1995

Related U.S. Application Data

[63] Continuation-in-part of Ser. No. 268,052, Jun. 29, 1994, abandoned.

[30] Foreign Application Priority Data

Jul. 15, 1993 [JP] Japan .................. 5-196712

[51] Int. Cl.⁶ .................................. C23C 14/34
[52] U.S. Cl. .................. 204/298.13; 204/298.12
[58] Field of Search ............................. 426/614, 635, 426/641, 660, 661, 662, 663, 664, 665; 204/298.12, 298.13

[56] References Cited

U.S. PATENT DOCUMENTS

| | | | |
|---|---|---|---|
| 4,620,872 | 11/1986 | Hijikata et al. | 420/83 |
| 5,190,630 | 3/1993 | Kikuchi et al. | 204/192 |
| 5,282,946 | 2/1994 | Kinoshita et al. | 204/298.13 |

FOREIGN PATENT DOCUMENTS

| | | | |
|---|---|---|---|
| 0281141 | 9/1988 | European Pat. Off. | |
| 0342894 | 11/1989 | European Pat. Off. | |
| 0500031 | 8/1992 | European Pat. Off. | |
| 0535314 | 4/1993 | European Pat. Off. | 204/198.13 |
| 62-287070 | 12/1987 | Japan | 204/298.13 |
| 63-171876 | 7/1988 | Japan | 204/298.13 |
| 3-47963 | 2/1991 | Japan | 204/298.13 |
| 4-333565 | 1/1992 | Japan | 204/298.12 |
| 92-101080 | 1/1992 | WIPO | 204/298.13 |

*Primary Examiner*—John Zimmerman
*Attorney, Agent, or Firm*—Seidel Gonda Lavorgna and Monaco

[57] ABSTRACT

A mosaic target comprising a plurality of target block pieces of different kinds of materials selected from the group consisting of Ta, Mo, Ti, W, Zr, Nb and Si, and their alloys and compounds, said target block pieces being combined in a stripe pattern or in a radial pattern characterized in that said target block pieces have their abutting interfaces solid-phase bonded at a temperature no more than the melting points of the target block piece materials. A typical example is a Ta-Mo mosaic target. The solid-phase bonded mosaic target blank is machined to a target which is bonded to a backing plate. The solid-phase bonding produces a mosaic target of a unitary construction, eliminating gaps among the target block pieces without sacrificing the properties of the individual block pieces. Abnormal discharge owing to gaps or contamination of the resulting film by concurrent sputtering of the solder or the backing plate is avoided.

4 Claims, 2 Drawing Sheets

MOSAIC TARGET

[CROSS REFERENCE TO RELATED APPLICATION]

This application is a continuation-in-part of our application Ser. No. 08/268,052 filed Jun. 29, 1994, now abandoned.

[FIELD OF THE INVENTION]

This invention relates to a mosaic target comprising a plurality of target block pieces of dissimilar materials, and more specifically to a mosaic target in which the target block pieces are solid-phase bonded at their abutting interfaces.

[BACKGROUND OF THE INVENTION]

Targets are usually disk or rectangular shaped plates, which serve as sources of substances to be sputtered on substrates such as wafers to form thereon electrodes, gates, conductor lines, elements, insulating films, protective films and the like of various semiconductor devices. As accelerated ions impinge on a target surface, the atoms constituting the target are partly released by momentum exchange from the target surface to the ambient space to deposit on an oppositely located substrate. Typical sputtering targets in use include the targets made of Al and Al alloys, refractory metals and their alloys (W, Mo, Ti, Ta, Zr, Nb, etc. and their alloys such as W-Ti), and metal silicides ($MoSi_x$, $WSi_x$, $NiSi_x$ etc.).

Generally, targets of two or more different elements are made by alloying or compounding those elements by melting or powder metallurgy. Where a target of good quality is not obtained by these methods because of the density, composition, oxygen concentration, or other problem, the adoption of a mosaic target system is often an alternative. The mosaic target system is realized, when a target is to be formed of two or more elements, by working the materials of individual elements or their alloys or compounds to suitable shapes and appropriately combining and arranging them to form altogether a disk or rectangular plate as a target of a desired composition. The target thus combined and arranged is called a mosaic target. In the mosaic target, the appropriately shaped pieces of each element or its alloy or compound which constitute the structural units are arranged in a combination in abutting relation. These structural units are called as target block pieces. For example, in a Ta-Mo mosaic target, Ta block pieces and Mo block pieces are alternately combined and arranged in a stripe pattern or in a radial pattern.

Examples of mosaic targets, besides the Ta-Mo target, are targets of alloys of refractory metals such as Ta-W, Ta-Ti and W-Ti, and silicide targets.

Conventional mosaic targets are fabricated by putting the target block pieces together in abutting relation and bonding them in that abutting state to a backing plate with the use of a solder, namely a brazing metal such as In or the like or by shrink fitting them directly on and into a backing plate. In either case, gaps of several to several hundred microns are formed among the adjacent target block pieces at their abutting interfaces. The gaps can cause abnormal discharge, localized acceleration of sputtering rate that induces particle generation, or concurrent sputtering of the solder or backing plate, leading to contamination and deterioration of the characteristics of the resulting sputtered film on a substrate.

The term "particles" as used herein means the particulate matters that scatter within a film forming apparatus during thin film formation by sputtering and deposit in clusters on a substrate in the apparatus. The clustered particles often grow to sizes as large as several microns across. Their deposition on a substrate can cause problems, e.g., shorting or breaking of conductor lines in large-scale integrated circuits, resulting in an increased percentage of rejects. These particles originate from the particulate matters released from the target.

To avoid concurrent sputtering of the solder or backing plate, methods of working the block pieces have been adopted so that their abutting interface profiles are stepped or slanted as at (a) and (b), respectively, in FIG. 3. Here the target block pieces of materials A and B are alternately combined with their stepped or slanted interfaces in an abutting relation and bonded to a backing plate so that the backing plate and the solder are concealed from the surface to be sputtered. However, these approaches still are unable to control abnormal discharge and particle generation. Moreover, the additional working of the abutting interfaces of target block pieces reduce the yield, and in the targets that use expensive materials the material cost increases, and further, working cost is expensive too. In some target materials, even such additional working is difficult to perform.

It is demanded to develop a mosaic target which precludes the possibility of abnormal discharge or particle generation due to gaps at the abutting interfaces of mosaic target block pieces without requiring unwanted and superfluous working of the target material.

Needless to say, means to be taken must be one which can prevent the deterioration of quality characteristics of individual target block pieces such as crystal grain growth, the change of crystal orientation and others and cause little deformation or other adverse effects upon the target block pieces.

[OBJECT OF THE INVENTION]

The object of this invention is to provide a mosaic target which precludes the possibility of abnormal discharge or particle generation due to gaps at the abutting interfaces of target block pieces and which does not require unwanted and superfluous working of the target material while holding the quality characteristics of the target block pieces.

[SUMMARY OF THE INVENTION]

It has now been found that the above-mentioned problems can be solved by solid-phase bonding, e.g., by hot isostatic pressing (HIP), hot pressing, or explosive welding, of the target block pieces constituting a mosaic target. On the basis of this discovery, this invention provides a mosaic target comprising a plurality of target block pieces of different kinds of materials selected from the group consisting of Ta, Mo, Ti, W, Zr, Nb and Si, and their alloys and compounds, preferably said target block pieces being combined in a stripe pattern or in a radial pattern, characterized in that said target block pieces of different kinds of materials have their abutting interfaces which have been solid-phase bonded at a temperature no more than the melting points of the target block piece materials. The abutting interface is preferably of a rectangular having a length of no less than 30 mm in the longer side and a length of no less than 5 mm in the shorter side. A typical embodiment includes a mosaic target comprising Ta target block pieces and Mo target block pieces, said Ta and Mo target block pieces being combined in a stripe pattern or in a radial pattern characterized in that said Ta and Mo target block pieces have their abutting interfaces which have been solid-phase bonded at a temperature no more than the melting points of Ta and Mo.

Solid-phase bonding of the target block pieces at their abutting interfaces eliminates gaps between the adjacent target block pieces and averts abnormal discharge due to the gaps and also the contamination of the resulting film as a result of concurrent sputtering of a solder or backing plate, and can hold the quality characteristics such as crystal grain growth, the change of crystal orientation and others and cause little deformation or other adverse effects upon the individual target block pieces.

The term "target block pieces" means herein the divided structural units of a target which are arranged in abutting relation so as to form altogether a target of a desired composition and which is preferably arranged in a stripe pattern or in a radial pattern and is so bulky that the abutting interface is of a rectangular having a length of no less than 30 mm in the longer side and a length of no less than 5 mm in the shorter side.

By the term "solid-phase bonding" is meant any of the methods in which solid material pieces are brought into contact state and a suitable pressure is applied at a suitable temperature no more than the melting points of the materials to induce the diffusion of atoms across and along their abutting interface, generation of interatomic forces, etc. to thereby bond or join the solid material pieces together without incurring the melting of the solid material pieces. A mosaic target of a unitary structure is obtainable by eliminating gaps among the target block pieces substantially without the sacrifice of the properties of the individual target block pieces.

Preferably, a first kind of target block pieces of a first material and a second kind of target block pieces of a second material are alternately arranged in a radial pattern or in a stripe pattern superposed in alternate layers and bonded at their abutting interfaces by solid-phase bonding, such as HIP or hot pressing, and the solid-phase bonded mosaic target blank is machined to a target which is bonded to a backing plate with the use of a solder. Alternatively, a target may be bonded to a backing plate by solid-phase bonding.

There are no references which disclose a mosaic target comprising a plurality of target block pieces of different kinds of materials selected from the group consisting of Ta, Mo, Ti, W, Zr, Nb and Si, and their alloys and compounds characterized in that said target block pieces of different kinds of materials have their abutting interfaces solid-phase bonded. There are no references stating that materials selected from Ta, Mo, Ti, W, Zr, Nb and Si, and their alloys and compounds are used to produce a mosaic target.

U.S. Pat. No. 4,620,872 describes a composite target used in the sputter-production of a thin film made of a rare earth metal (Gd, Tb, Dy) and a transition metal (Fe, Co) for use as a magnetooptical recording material and a process for producing the same. The process comprises the steps of preparing a mixture of rare earth metal in the form of powder, small particles, chips or combinations thereof and transition metal powder and hot forming the mixture at a temperature lower than the eutectic point of the system of the metallic components in the mixture to thereby form an intermetallic compound at the interface between the rare earth metal and the transition metal while causing said metals to be bonded together. The starting rare earth metal has an average size of 10 μm to 5 mm with the range of 10 μm–0.8 mm being selected for the powder and and 0.8–5 mm for small particles and chips. The most preferred average size is in the range of 0.1–3 mm. On the other hand, the transition metal powder has an average particle size of 1–200 μm. They can not be called block pieces as in this invention since even with a combination of the largest starting materials considerable, a mixture of rare earth transition metal in the form of chips having an average size of 5 mm and the transition metal powder having an average particle size of 200 μm is involved therein.

U.S. Pat. No. 5,282,946; Japanese Patent Application Kokai No. 4-333565; and European Patent Application Publication No. 0,535,314 all disclose a sputtering target of Pt-Co alloy which is produced by bringing adjacent target members at their end faces into contact each other and joining them together by fusion. One of the most important points of this invention is to bond adjacent target members (block pieces) by solid-phase bonding in order to avoid the fusion of members.

Japanese Patent Application Kokai No. 62-287070 describes a sintered target made of a rare earth metal (Gd, Tb, Dy) and a transition metal (Fe, Co) for use as a magnetooptical recording material and a process for producing the same as in U.S. Pat. No. 4,620,872 mentioned above. A rare earth metal and a transition metal system alloy is first melted to form a molten alloy and the molten alloy is injected on the roll surface of a cooling roll to be rapidly cooled and form an elongated amorphous thin film of the alloy having the width of 40 mm and the thickness of 50 μm according to an example or otherwise the molten alloy is atomized to form a powder of the alloy having an average particle diameter of 1 to 5 μm. In the case of the thin film, the elongated thin film is cut to the length of 300 mm. The amorphous thin films each having the width of 40 mm and the thickness of 50 μm and the length of 300 mm are superposed so as to form the whole height of 10 mm followed by sintering by HIP with a temperature of 500° to 700° C. and a pressure of 1.0 to 1.4 ton/cm$^2$. The alloy powder also is sintered. This reference is decisively different from this invention in that a rare earth metal and a transition metal system alloy is first melted. Thin films having thickness of 50 μm or powder having an average particle diameter of 1 to 5 μm are produced for sintering and such thin film or powder can not called as block pieces. In the case of thin films, all thin films to be superposed are of the same alloy.

Japanese Patent Application Kokai No. 63-171876 describes a composite target for a magnetic disk which is made of a metal or an alloy (Co, Co-Ni) and another kind of a metal or an alloy (Pt, Au, Re, Pd, Sm, Tb) wires. This target is produced by forming a plate of said metal or alloy with via holes having interspacing of no more than 25 mm so that the area ratio of the via holes to the plate corresponds to an aimed alloy composition, filling into the via holes said another kind of a metal or an alloy and sealing the plate filled with such metal or alloy into a vacuum capsule followed by subjecting it to HIP. The diameter of via holes are stated to be desirably no more than 10 mm. In an example, a Co-Ni-Pt disc is formed with via holes having the diameter of 3.75 ±0.01 mm into which Pt wires having the diameter of 3.76 mm are inserted. This reference is far away from a mosaic target of this invention wherein a plurality of target block pieces are solid-phase bonded at their abutting interfaces in a stripe pattern or in a radial pattern.

Japanese Patent Application Kokai No. 3-47963 describes a special arrangement of target pieces in irregular erosion region and has no reference as to the bonding of the target pieces.

PCT International Publication Number WO 92/01080 discloses a sputter target adapted especially for providing coating on the annular portion of compact discs. The crystallographic orientation of the target material (Al, Au, Pt, Cu, Ni, Ag, Pd) is provided so that the preferred angle of atomic emission from the target is arranged substantially perpendicular to the compact disc substrate to be coated. This reference does not relate to a mosaic target of target block pieces of dissimilar materials.

[DETAILED EXPLANATION OF EMBODIMENTS]

This invention is directed to a mosaic target made of different kinds of materials selected from the group consisting of refractory metals such as Ta, Mo, Ti, W, Zr and Nb, and their alloys and compounds such as metal silicides ($MoSi_x$, $WSi_x$ etc.). This invention is particularly applicable to cases where targets of favorable properties cannot be obtained by melting or powder metallurgy because of the density, composition, oxygen concentration, or other problems, or to cases where the production by melting process itself is difficult. Cases where this invention is favorably applicable are the fabrication of mosaic targets of refractory metal alloys such as Ta-Mo, Ta-W, Ta-Ti and W-Ti alloys.

As explained above, solid-phase bonding refers to any of processes in which target block pieces held in contact are bonded by the application of a suitable light pressure at a suitable temperature of no more than melting points of target block pieces used. The use of solid-phase bonding in the fabrication of a mosaic target makes possible the manufacture of a target of unitary structure free of gaps among the target block pieces practically without sacrificing the density, composition, and other crystal properties of those target block pieces. To constitute an objective mosaic target, two or more kinds of the target block pieces a singular element or its alloy or compound are combined and arranged in abutting state. Solid-phase bonding can be accomplished in a variety of ways, including HIP, hot pressing, and explosive welding. The target block pieces in abutting state at their interfaces can be bonded by holding them at a temperature which is suited for the target block pieces materials and is no more than melting points of the materials, with the application of an appropriate light pressure or without load for a given period of time. The bonding temperature varies with the solid-phase bonding method used. For example, in the case of solid-phase bonding by HIP or hot pressing of a combination of Ta and Mo target block pieces, the solid-phase bonding is achieved at a temperature in the range of 700°–2000° C. and under a load of 0.5–15 kg/mm² (5–150 MPa). The target blank thus formed by solid-phase bonding is then machined to a target of predetermined diameter and thickness.

The abutting interface of the target block pieces is preferably of a rectangular having a length of no less than 30 mm in the longer side and a length of no less than 5 mm in the shorter side, since this size is favorable to lower working cost and obtain an adequate bonding strength.

Figure 1A:
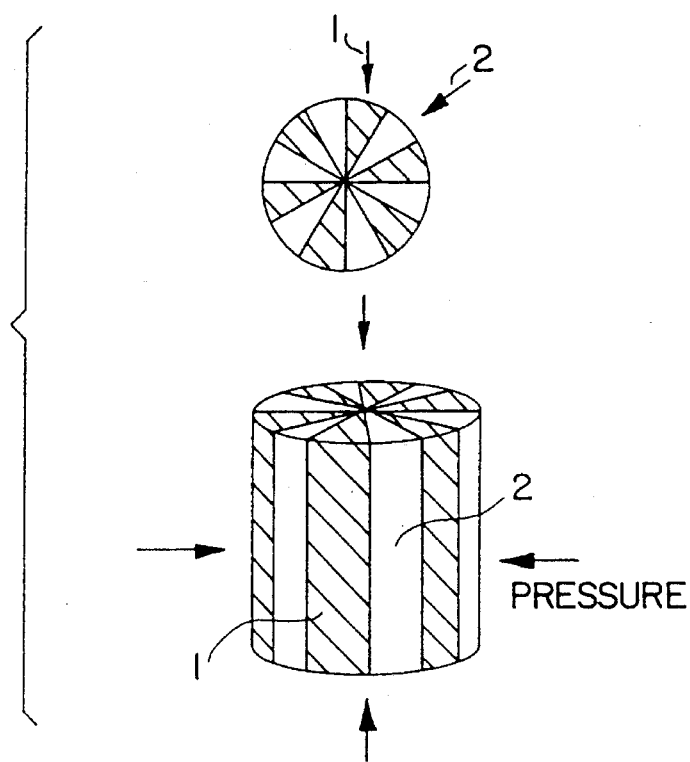
FIGS. 1(i a) and 1(b) illustrate examples of target block piece arrangement and pressure application wherein 1(a) shows segmental block pieces of two different materials alternately arranged in a radial pattern and bonded together by solid phase with HIP into a composite target blank in the form of a right rod or cylinder and 1(b) shows another composite target blank formed of target block pieces in the form of flat plates of two different materials, superposed in alternate layers so as to form a stripe pattern and bonded by solid phase bonding with hot pressing.
Figure 1B:
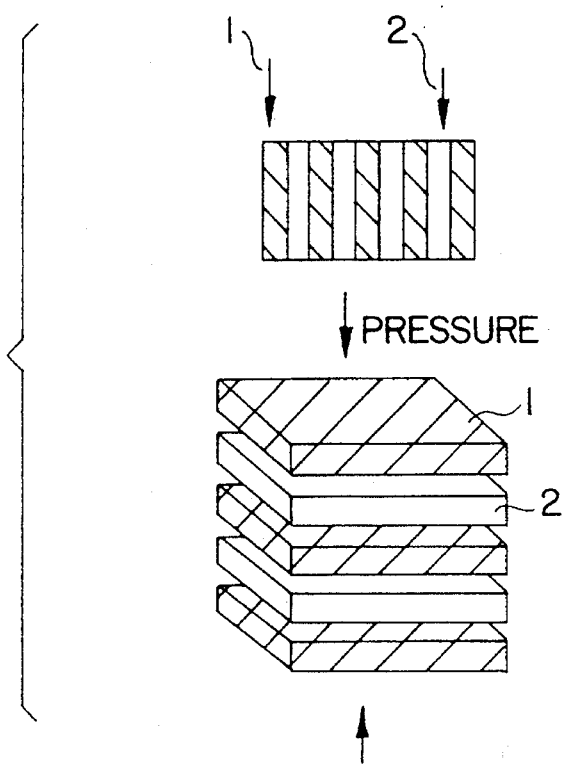
Figure 3A:
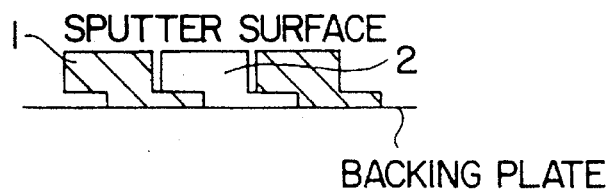
FIGS. 3(a) and 3(b) show how the abutting interfaces of conventional target pieces were profiled and arranged wherein 3(a) shows stepped abutted interfaces and 3(b) shows slanted abutted interfaces.
Figure 3B:
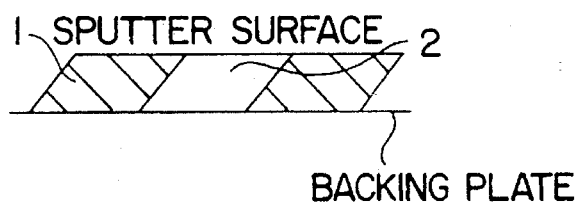

FIGS. 1(a) and 1(b) illustrate examples of the arrangement of target block pieces and how pressure is applied. At 1(a), segmental target block pieces 1 of material A and similarly shaped target block pieces 2 of material B are shown alternately arranged in a radial pattern and bonded together by solid-phase bonding, e.g., HIP, into a composite target blank in the form of a right rod or cylinder. Shown at 1(b) is another composite target blank formed of target block pieces in the form of flat plates 1 of material A and similar target block pieces 2 of material B, superposed in alternate layers so as to form a stripe pattern and solid-phase bonded, e.g., by hot pressing. The solid-bonded target blanks are machined to targets of desired diameter and thickness. The amounts of materials used are by far less than the case of the conventional blanks referred to in FIGS. 3(a) and 3(b).

Generally, a target produced is bonded to a backing plate with the use of a solder such as In. Alternatively, a target may be bonded to a backing plate by solid-phase bonding.

Depending on the configurations desired for specific applications, the targets need not be made in one piece but may be divided into two or several sections unless the division brings any trouble. In the latter case, because a great majority of the target block pieces have already been bonded by solid-phase bonding at their abutting interfaces of each section, it is possible to reduce abnormal discharge and contamination of a solder or backing plate material to almost nil.

As a result, a mosaic target produced has high adhesion and high bond strength accompanied with no appreciable deformation and uneven deformation of the target material and without non-bonded portions such as pores along the interface while substantially maintaining the crystal characteristics which the target block pieces had before the bonding intact resulting in inhibiting the destruction of uniform microstructure, the growth of crystal grains, the change of crystal orientation etc.

[EXAMPLES]

Figure 2:
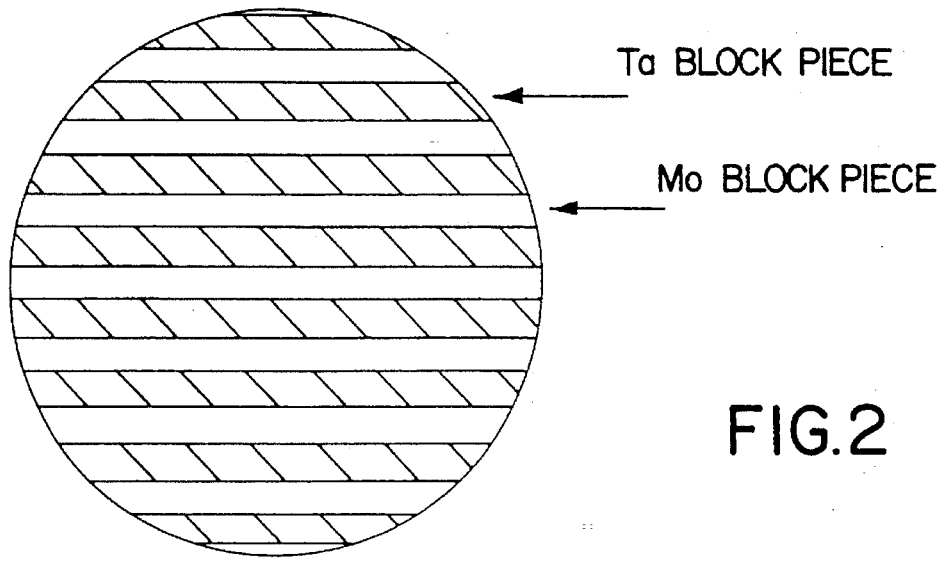
FIG. 2 is a top view of a Ta-Mo mosaic target used in an example of the invention.

A 4-in. diameter Ta-Mo mosaic target of 5 mm thickness was produced by arranging Ta block pieces (6.5 mm wide) and Mo block pieces (6.5 mm wide) in a stripe pattern as shown in FIG. 2 and bonding them by solid-phase bonding at their abutting interfaces. The mosaic target produced was actually sputtered in a sputtering apparatus and observed for the occurrence of abnormal discharge during sputtering, and then the properties of the film thus formed by sputtering was evaluated.

A mosaic target was assembled from 6.5 mm-thick Ta plates and 6.5 mm-thick Mo plates by superposing them in alternate layers and bonding them in solid-phase by HIP. The HIP conditions were: temperature=1400° C.; pressure=1 kg/mm² (10 MPa); and holding time=1 hr. The composite material blank was machined to a 4-in. diameter target. It was confirmed by observation under a scanning electron microscope that there was no gap among the joint portions.

This mosaic target was bonded to a Cu backing plate with In solder to make a target assembly.

This target assembly was sputtered under the conditions listed below, and the frequency of abnormal discharge was found to be zero during a sputtering period of 10 minutes. Neither the Cu that constituted the backing plate nor the In that formed the solder was detected from the sputtered film produced on a substrate.

(Sputtering conditions)

Atmosphere: Ar

Pressure: 0.5 Pa

Power density: 5 W/cm$^2$

Substrate: "Corning 7059" glass

Substrate temperature: room temperature

Simple mosaic targets the pieces of which were merely placed in abutted relation with no solid-phase bonded interfaces and bonded to a backing plate with an In solder were used as comparative examples.. With those targets abnormal discharge occurred from several times to several ten times. In contaminant from the In solder was detected from the films formed by sputtering, in amounts from several ten to several hundred parts per million. The amounts of particle generation were many, too.

Thus, the solid-phase bonding of target block pieces at their abutting interfaces ensures the prevention of abnormal discharge and contamination with a solder or backing plate. Hence, it is assured that sputter films with good film qualities can be formed in a stable manner.

[ADVANTAGES OF THE INVENTION]

The use of a mosaic target according to this invention permits sputtering to be performed in stable conditions without the occurrence of abnormal discharge or particle generation. The resulting sputter film exhibits high film quality with no contamination by a solder or backing plate used. Moreover, there is no need of machining the abutting interfaces of target block pieces to complex contours as has been necessary heretofore, and the material loss due to machining and the machining cost can be saved.

What we claim is:

1. A mosaic target comprising a plurality of target block pieces of different kinds of materials selected from the group consisting of Ta, Mo, Ti, W, Zr, Nb and Si, and their alloys and compounds, characterized in that said target block pieces of different kinds of materials have their abutting interfaces which have been solid-phase bonded at a temperature no more than the melting points of the target block piece materials.

2. A mosaic target comprising a plurality of target block pieces of different kinds of materials selected from the group consisting of Ta, Mo, Ti, W, Zr, Nb and Si, and their alloys and compounds, said target block pieces having their abutting interfaces and being combined in a stripe pattern or in a radial pattern characterized in that said target block pieces of different kinds of materials have their abutting interfaces which have been solid-phase bonded at a temperature no more than the melting points of the target block piece materials.

3. A mosaic target comprising a plurality of target block pieces of different kinds of materials selected from the group consisting of Ta, Mo, Ti, W, Zr, Nb and Si, and their alloys and compounds, said target block pieces being combined in a stripe pattern or in a radial pattern characterized in that said target block pieces of different kinds of materials have their abutting interfaces which have been solid-phase bonded at a temperature no more than the melting points of the target block piece materials and said abutting interface is of a rectangular having a length of no less than 30 mm in the longer side and a length of no less than 5 mm in the shorter side.

4. A mosaic target comprising Ta target block pieces and Mo target block pieces, said Ta and Mo target block pieces being combined in a stripe pattern or in a radial pattern characterized in that said Ta and Mo target block pieces have their abutting interfaces which have been solid-phase bonded at a temperature no more than the melting points of Ta and Mo.

* * * * *